(12) United States Patent
Shutoku et al.

(10) Patent No.: US 7,170,331 B2
(45) Date of Patent: Jan. 30, 2007

(54) DELAY CIRCUIT

(75) Inventors: Toshiyuki Shutoku, Aichi (JP); Koji Hayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/080,685

(22) Filed: Mar. 16, 2005

(65) Prior Publication Data

US 2005/0206425 A1    Sep. 22, 2005

(30) Foreign Application Priority Data

Mar. 18, 2004    (JP)    ............................. 2004-077636

(51) Int. Cl.
*H03H 11/26*    (2006.01)
(52) U.S. Cl. ...................... 327/261; 327/276
(58) Field of Classification Search .................. None
See application file for complete search history.

(56) References Cited

U.S. PATENT DOCUMENTS

| | | | | |
|---|---|---|---|---|
| 4,922,141 | A * | 5/1990 | Lofgren et al. | 327/158 |
| 5,309,035 | A * | 5/1994 | Watson et al. | 327/141 |
| 5,349,612 | A * | 9/1994 | Guo et al. | 375/371 |
| 5,374,860 | A * | 12/1994 | Llewellyn | 327/276 |
| 5,561,692 | A * | 10/1996 | Maitland et al. | 375/371 |
| 5,892,406 | A * | 4/1999 | Dicke et al. | 331/10 |
| 5,909,133 | A * | 6/1999 | Park | 327/277 |
| 6,025,747 | A * | 2/2000 | Okayasu et al. | 327/407 |
| 6,546,048 | B1 * | 4/2003 | Ichiba et al. | 375/238 |
| 6,674,314 | B2 * | 1/2004 | Takai | 327/158 |
| 6,798,258 | B2 * | 9/2004 | Rieven | 327/152 |

FOREIGN PATENT DOCUMENTS

JP    11-273252    10/1999

* cited by examiner

*Primary Examiner*—Timothy P. Callahan
*Assistant Examiner*—Cassandra Cox
(74) *Attorney, Agent, or Firm*—Fish & Richardson P.C.

(57) ABSTRACT

A delay circuit comprising a delay line to delay an input signal that has a plurality of delay cells connected in series; a PLL circuit that supplies the delay line with a delay control voltage to control the delay; and a first selector that selects one of output signals of the delay cells.

Each of the delay cells comprises two stages of delay inverters connected in series and an output inverter connected to a connection point of the delay inverter of the first stage and the delay inverter of the second stage. Input into the delay inverter of the first stage is an output signal of the delay inverter of the second stage in the preceding delay cell, and the first selector outputs as a delayed signal an output signal of the output inverter or the delay inverter of the second stage in one of the delay cells.

5 Claims, 2 Drawing Sheets

DELAY CIRCUIT

CROSS-REFERENCE TO RELATED APPLICATIONS

The present application claims priority upon Japanese Patent Application No. 2004-077636 filed on Mar. 18, 2004, which is herein incorporated by reference.

BACKGROUND OF THE INVENTION

1. Field of the Invention

The present invention relates to a delay circuit for preventing the reduction in recording accuracy at high speed recording on a disk.

2. Description of the Related Art

Data-recordable optical disk apparatuses and magneto optical disk apparatuses write data onto a disk by recording record marks corresponding to a data modulated signal on the disk with a laser. For example, for CD-Rs, first, data to be recorded is modulated into an EFM signal in an EFM encoder, and this EFM signal is sent to a laser apparatus, and then record marks corresponding to the EFM signal are recorded on a disk.

However, because the record state varies depending on the type of medium to record data thereon and on the rotation speed of the disk, desired record marks cannot be recorded by simply sending the EFM signal to the laser apparatus.

Accordingly, by delaying the timings of the rising and falling of the EFM signal, desired record marks are recorded. In order to delay the EFM signal, a delay line constituted by a plurality of stages of delay cells connected in series is used as disclosed in, for example, the delay circuit of FIG. 2 of Japanese Patent Application Laid-open Publication No. 11-273252. A to-be-delayed signal is inputted into the delay cell of the first stage, and a selector selects one of the outputs from the delay cells of the stages and outputs as a delayed signal. Such a delay circuit is used in the pulse width controller of FIG. 1 of the above Japanese Publication, which is used in the disk recording controller of FIG. 7 of the same.

Each delay cell of the delay line is constituted essentially by two inverters connected in series, and the output of the second inverter is a delayed signal selectable by the selector and is input into the delay cell of the next stage.

In the above-described delay circuit, only the output of the second inverter of the two inverters constituting each delay cell is led out as a delayed signal, and the output of the first inverter is not used. That is, only one delayed signal is obtained from each delay cell. For example, in the case of a delay circuit constituted by a delay line comprising 40 delay cells, only 40 different delayed signals are obtained, and the resolution obtained from the delay amount of each delay cell is no smaller than $(1/40) \times T$, where T is the cycle of the reference clock.

Furthermore, since the delay amount of each delay cell needs to be the same, in order to make it less susceptible to the effect of processing accuracy of the semiconductor process, the transistor sizes of the inverter have to be large to a certain degree. Hence, there is a limit to the reduction in the delay amount of each delay cell.

However, where data is recorded on a disk at high speed, with a resolution of such a level, the reduction in record accuracy may be caused.

SUMMARY OF THE INVENTION

Hence, it is an object of the present invention to provide a delay circuit that can double the accuracy in recording on a disk and to prevent the accuracy reduction at high speed recording.

A delay circuit of one aspect of the present invention comprises a delay line to delay an input signal that has a plurality of delay cells connected in series; a PLL circuit that supplies the delay line with a delay control voltage to control the delay; and a first selector that selects one of output signals of the delay cells. Each of the delay cells comprises two stages of delay inverters connected in series and an output inverter connected to a connection point of the delay inverter of the first stage and the delay inverter of the second stage. Input into the delay inverter of the first stage is an output signal of the delay inverter of the second stage in the preceding delay cell, and the first selector outputs as a delayed signal an output signal of the output inverter or the delay inverter of the second stage in one of the delay cells.

As opposed to the conventional art wherein only one delayed signal is obtained from one delay cell, the present invention, either the output inverter or the delay inverter of the second stage in one delay cell can be selected. Thus, without altering the PLL circuit to increase the frequency of the VCO, the resolution of the delay amount can be doubled. Therefore, when the delay circuit is applied to a disk recording controller, accuracy in recording on disks can be doubled and the accuracy reduction at high speed recording can be prevented.

This delay circuit may further comprise a signal delaying section that further delays the delayed signal output from the first selector and outputs the further delayed signal.

Thus, the signal delaying section further delays the delayed signal output from the first selector and outputs. Therefore, the delay can be controlled independently without being restricted by the delay control voltage supplied from the PLL circuit to the delay line at the preceding stage of the first selector.

Furthermore, the signal delaying section may include a plurality of buffer circuits connected in parallel; and a second selector that outputs an output of one of the buffer circuits as a delayed signal, wherein each of the buffer circuits has different delay amount.

Thus, the second selector outputs an output of one of the plurality of buffer circuits that differ in delay amount from each other as a delayed signal. Therefore, when outputting the delayed signal, the delay amount can be adjusted accurately.

Each of the buffer circuits may be constituted by a series circuit of a plurality of invertors, each of which is made up of transistors, and each of the buffer circuits may be different in the sizes of the transistors so that the buffer circuits are different in delay amount from each other.

Thus, by adjusting the sizes of the transistors, semiconductor elements, the delay amount can be adjusted more finely.

An output terminal through which the output signal of the delay inverter of the second stage is output may be connected to a load inverter or a load capacitor.

Thus, by means of the load capacitor connected to the output terminal through which the output signal of the delay inverter at the second stage is output, the delay amount of the delayed signal from the delay inverter at the second stage can be adjusted finely.

As opposed to the conventional art wherein only one delayed signal is obtained from one delay cell, the present invention, either the output inverter or the delay inverter of the second stage in one delay cell can be selected. Thus, without altering the PLL circuit to increase the frequency of the VCO, the resolution of the delay amount can be doubled. Therefore, when the delay circuit is applied to a disk recording controller, accuracy in recording on disks can be doubled and the accuracy reduction at high speed recording can be prevented.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the explanation in the present specification and the description of the accompanying drawings.

Embodiment 1

Figure 1:
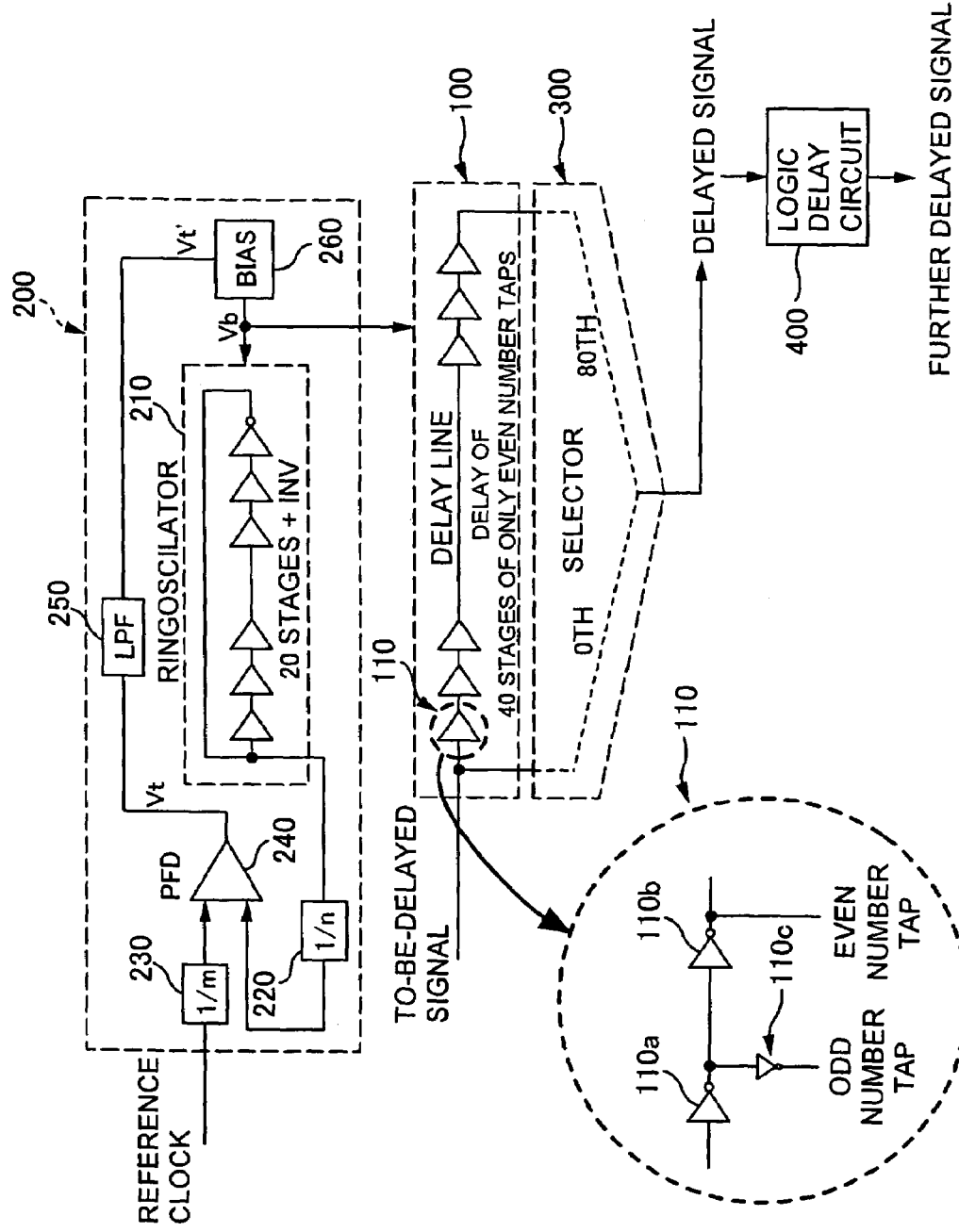
FIG. 1 is a block diagram showing a delay circuit according to an embodiment of the present invention.

A delay circuit according to an embodiment of the present invention will be described with reference to FIG. 1.

As shown in the Figure, the delay circuit comprises a delay line 100 that delays its input signal as a to-be-delayed signal, a PLL circuit 200 that controls the delay amount of this delay line, and a first selector 300 that selects from the output signals from the delay line 100. The PLL circuit 200 supplies the delay line 100 with a control voltage (delay control voltage) Vb to control the delay amount of the delay line 100. The delay line 100 has 40 delay cells 110 connected in series. Each delay cell 110 has two stages of delay inverters 110a, 110b connected in series and an output inverter 110c. The input terminal of the output inverter 110c is connected to the connection point of the delay inverter 110a at the first stage and the delay inverter 110b at the second stage. In the delay cell 110, the output signal from the delay inverter 110b at the second stage of the delay cell 110 of the preceding stage is inputted into the delay inverter 110a at the first stage. The first selector 300 selects and outputs the output signal of the output inverter 110c or the second delay inverter 110b of one of the delay cells 110 as a delayed signal.

According to this configuration, as opposed to the conventional art where only one delayed signal is obtained from one delay cell, in the present invention, the delayed signal is selectable from the two outputs of the output inverter 110c and the second delay inverter 110b in one delay cell 110. Thus, without altering the PLL circuit 200 to increase the oscillation frequency of a VCO 210 (described later), the resolution of the delay amount can be doubled. Therefore, where this delay circuit is applied to a disk recording controller, the accuracy in recording on a disk can be doubled and the accuracy reduction at high speed recording can be prevented.

The above configuration of the delay circuit will be described in more detail. As shown in the enlarged view of the delay cell 110 of FIG. 1, the output terminal of the output inverter 110c is used as a tap having an odd ordinal number (hereinafter, called an "odd number tap") and the output terminal of the second delay inverter 110b is used as a tap having an even ordinal number (hereinafter, called an "even number tap") for the whole delay line 100. The first selector 300 selects a delayed signal from the outputs of both the odd number taps and even number taps.

Figure 2:
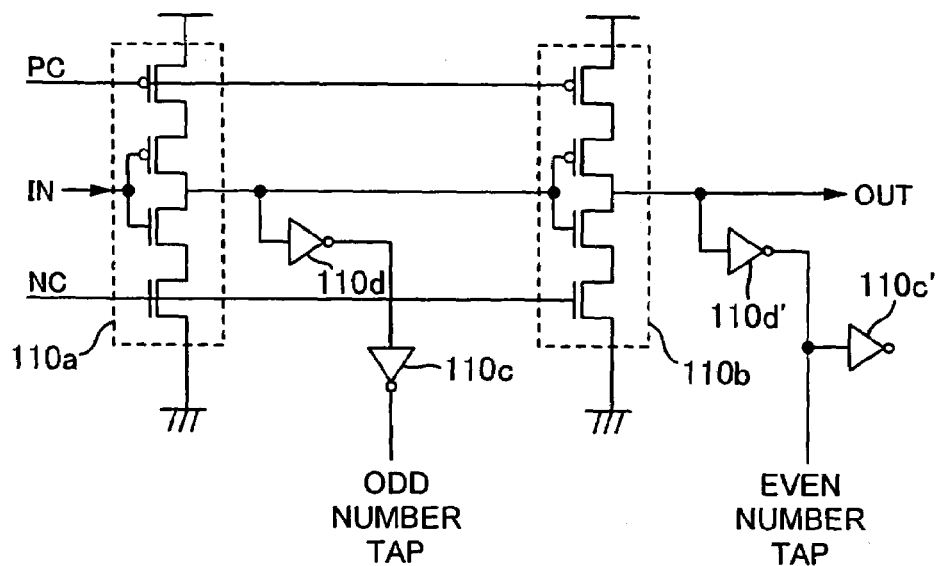
FIG. 2 is a circuit diagram showing the specific configuration of delay inverters of the delay circuit according to the embodiment of the present invention.

Note that the specific configuration of the delay inverters 110a, 110b of the delay cell 110 can take various forms such as the circuit configuration shown in FIG. 2. The output inverter 110c is a well-known inverter taken as having no delay compared with the delay inverters 110a, 110b.

Moreover, in FIG. 2, in order to equalize the loads on the output sides of the delay inverters 110a, 110b, inverters 110d, 110d' of the same configuration are connected to the output sides, respectively. Further, in order to equalize the loads on the output sides of the inverters 110d, 110d', an inverter (load inverter) 110c' having the same configuration as the output inverter 110c connected to the output side of the inverter 110d is connected to the output side of the inverter 110d'. The output of this inverter 110c' is open and functions only as a load. The inverter 110c may be substituted with a load capacitor C having its one end grounded, which enables fine adjustment of the delay amount of the delayed signal on the even number tap side.

The PLL circuit 200 comprises a VCO (voltage-controlled oscillator) 210 wherein a plurality of delay cells are connected in series like a feedback ring, frequency dividers 220, 230, a phase comparator 240, a low-pass filter 250, and a bias circuit 260. The frequency divider 230 divides a reference clock down to 1/m of its frequency and outputs to the phase comparator 240. The frequency divider 220 divides the output signal of the VCO 210 down to 1/n of its frequency and outputs to the phase comparator 240. The phase comparator 240 outputs a control voltage Vt corresponding to the phase difference between the output signals of the frequency dividers 220, 230 to the low-pass filter 250. A control voltage Vt' that is the control voltage Vt having passed through the low-pass filter 250 is input into the bias circuit 260. A biased control voltage Vb from the bias circuit 260 is supplied to the delay cells of the VCO 210 and the delay cells of the delay circuit 100.

For the delay line 100 comprising the 40 stages of delay cells 110, while in the conventional art using only the even number taps the delay resolution is of (1/40)×T, where T is the cycle of the reference clock, according to the present invention with this configuration, a delay resolution of (1/80)×T is obtained because the odd number taps are also included. That is, from the delay inverters 110a, 110b of the delay cells 110 connected in series, output signals delayed one after another by an interval of (1/80)×T are obtained. Let an even or odd number tap selected by the first selector 300 be the n-th tap, where n is a natural number, as seen from the to-be-delayed signal. Then a delay amount of (1/80)×T×n is obtained. Note that the delay amount of the EFM signal to be selected by the first selector 300 can be set separately for the rising and falling thereof.

Embodiment 2

Embodiment 2 that is a further improvement over the delay circuit of embodiment 1 will be described. As shown in FIG. 1, the delay circuit further comprises a logic delay circuit (signal delaying section) 400. This logic delay circuit further delays the delayed signal output from the first selector 300 and outputs the further delayed signal. With this configuration, the delay can be controlled independently without being restricted by control voltage Vb supplied from the PLL circuit 200 to the delay line at the preceding stage of the first selector 300.

The specific configuration of the logic delay circuit 400 includes a plurality (e.g. four) of buffer circuits 410 having the delayed signal from the first selector 300 inputted thereto and a non-inverting multiplexer (second selector) 420 with a plurality (the same number as that of the buffer circuits, e.g. four) of inputs. The buffer circuits 410 are connected in parallel and configured to differ in delay amount from each other. The non-inverting multiplexer 420 selects one of the outputs of the buffer circuits 410 according to a select signal applied to its input terminals and outputs as a delayed signal.

In this way, one of the plurality of buffer circuits 410 different in delay amount from each other is output as a delayed signal. Thus, fine adjustment of the delay amount of the delayed signal becomes possible.

Figure 3:
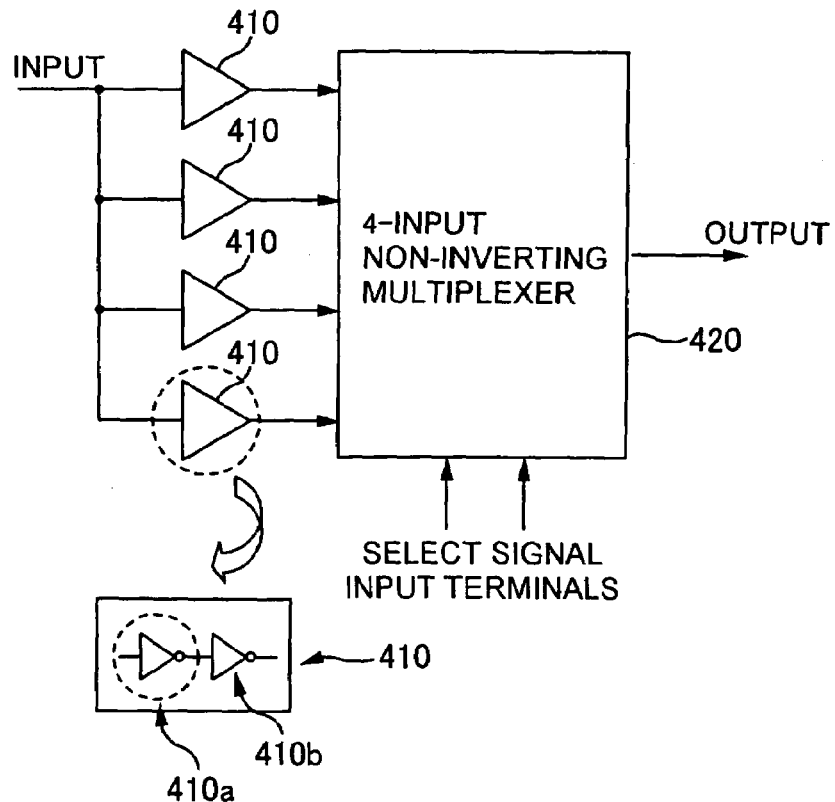
FIG. 3 is a block diagram showing a logic delay circuit of a delay circuit according to an embodiment of the present invention.

The logic delay circuit 400 will be described in more detail. As shown in the lower part of FIG. 3, the buffer circuit 410 is constituted by a series circuit of two inverters 410a, 410b. The inverters 410a, 410b are smaller in transistor size than the delay inverters 110a, 110b and thus smaller in delay amount. In order to make the delay amount of each buffer circuit 410 different from the others, the sizes of the transistors forming the preceding inverter 410a of each buffer circuit 410 are adjusted so as to be different from the other buffer circuits'. In this way, by adjusting the sizes of the transistors, semiconductor elements, the delay amount can be adjusted finely.

Exemplary Effect

For example, if record speed for a disk is four multiple speed and the cycle T of the reference clock is 9.6 ns, the limit cycle down to which the VCO 210 can be in lock is the cycle T of 9.6 ns. For this case, in the conventional art, the resolution obtained from the 40 stages of only even number taps of the delay line 100 defines the accuracy of the delay amount.

And in the case where record speed is eight multiple speed higher than the above, the cycle T of the reference clock is 4.8 ns. For this case, in the conventional art, the accuracy of the delay amount is no better than the resolution obtained from 20 stages of only even number taps of the delay line 100. On the other hand, in embodiment 1, the resolution obtained from 40 stages of both even and odd number taps of the delay line 100 defines the accuracy of the delay amount, and therefore, the resolution of double accuracy is obtained compared with the conventional art.

Moreover, in the case where record speed is 16 multiple speed even higher than the above, the cycle T of the reference clock is 2.4 ns. For this case, in the conventional art, the accuracy of the delay amount is no better than the resolution obtained from 10 stages of only even number taps of the delay line 100. On the other hand, in embodiment 2, there are 20 stages of both even and odd number taps, and if two stages are provided in the logic delay circuit 400, the accuracy of the delay amount is defined by the resolution obtained from a total of 40 stages. Thus, the resolution of four-fold accuracy is obtained compared with the conventional art.

Although the preferred embodiment of the present invention has been described in detail, the above embodiment is provided to facilitate the understanding of the present invention and not intended to limit the present invention. It should be understood that various changes, substitutions and alterations can be made therein without departing from spirit and scope of the invention and that the present invention includes its equivalents.

What is claimed is:

1. A delay circuit comprising:
   a delay line to delay an input signal that has a plurality of delay cells connected in series;
   a PLL circuit that supplies the delay line with a delay control voltage to control the delay line; and
   a first selector that selects one of output signals of the delay cells,
   wherein each of the delay cells comprises two stages of delay inverters connected in series and an output inverter connected to a connection point of the delay inverter of the first stage and the delay inverter of the second stage,
   wherein input into the delay inverter of the first stage is an output signal of the delay inverter of the second stage in the preceding delay cell, and
   wherein the first selector outputs as a delayed signal
      an output signal of the delay inverter of the first stage, the output signal being inverted by the output inverter, or
      an output signal of the delay inverter of the second stage, the output signal being not inverted,
   in one of the delay cells.

2. The delay circuit according to claim 1, further comprising:
   a signal delaying section that further delays the delayed signal output from the first selector and outputs the further delayed signal.

3. The delay circuit according to claim 2, wherein the signal delaying section includes:
   a plurality of buffer circuits connected in parallel; and
   a second selector that outputs an output of one of the buffer circuits as a delayed signal,
   wherein each of the buffer circuits has different delay amount.

4. The delay circuit according to claim 3, wherein each of the buffer circuits is constituted by a series circuit of a plurality of invertors, each of which is made up of transistors, and each of the buffer circuits is different in the sizes of the transistors.

5. the delay circuit according to claim 1, wherein an output terminal of the delay inverter of the second stage is connected to a load inverter or a load capacitor.

* * * * *